United States Patent
Rauwolf et al.

(10) Patent No.: US 11,204,380 B2
(45) Date of Patent: Dec. 21, 2021

(54) MODULE TUNING USING VIRTUAL GAIN CORRECTION

(71) Applicant: Andrew Wireless Systems GmbH, Buchdorf (DE)

(72) Inventors: Thomas Rauwolf, Minderoffingen (DE); Patrick Braun, Munningen (DE); Roland Hönle, Wolferstadt (DE); Herbert Schreiber, Rennerrtshofen (DE)

(73) Assignee: Andrew Wireless Systems GmbH, Buchdorf (DE)

( * ) Notice: Subject to any disclaimer, the term of this patent is extended or adjusted under 35 U.S.C. 154(b) by 0 days.

(21) Appl. No.: 16/752,948

(22) Filed: Jan. 27, 2020

(65) Prior Publication Data
US 2020/0252995 A1 Aug. 6, 2020

Related U.S. Application Data

(60) Provisional application No. 62/801,343, filed on Feb. 5, 2019.

(51) Int. Cl.
*H04W 88/08* (2009.01)
*H03M 1/10* (2006.01)
(Continued)

(52) U.S. Cl.
CPC ............. *G01R 27/28* (2013.01); *G01R 17/04* (2013.01); *G01R 27/30* (2013.01);
(Continued)

(58) Field of Classification Search
CPC ........ G01R 27/28; G01R 17/04; G01R 27/30; H04W 88/085; H04W 72/0453;
(Continued)

(56) References Cited

U.S. PATENT DOCUMENTS

| 7,548,742 B2* | 6/2009 | Johnson | H03C 3/403 341/126 |
| 2006/0085727 A1* | 4/2006 | Azenkot | H04L 5/12 714/792 |

(Continued)

FOREIGN PATENT DOCUMENTS

| GN | 107612615 A | 1/2018 |
| WO | 2006052599 A2 | 5/2006 |

OTHER PUBLICATIONS

International Searching Authority, "Invitation to Pay Additional Fees from PCT Application No. PCT/EP2020/052637", from Foreign Counterpart to U.S. Appl. No. 16/752,948, filed Jun. 4, 2020, pp. 1 through 14, Published: WO.
(Continued)

*Primary Examiner* — Alvaro E Fortich
*Assistant Examiner* — Zannatul Ferdous
(74) *Attorney, Agent, or Firm* — Fogg & Powers LLC

(57) ABSTRACT

A method of tuning a production module using a reference module with virtual gain correction is provided. The method includes selecting a counterpart reference module created for a select application. The production module is commutatively coupled to the selected counterpart reference module to generate a production module pair. A production module gain curve for the production module pair is measured for each frequency band to be used by the production module. The production module is tuned based at least in part on offset gain values at select number of frequency observation points for each frequency band associated with the counterpart reference module and gain values at the select number of frequency observation points of the measured production module gain curve for each frequency band.

14 Claims, 10 Drawing Sheets

(51) Int. Cl.
   *H01Q 21/28*    (2006.01)
   *H04W 72/04*    (2009.01)
   *G01R 27/28*    (2006.01)
   *G01R 17/04*    (2006.01)
   *G01R 27/30*    (2006.01)

(52) U.S. Cl.
   CPC .......... *H04W 88/085* (2013.01); *H01Q 21/28* (2013.01); *H03M 1/1028* (2013.01); *H04W 72/0453* (2013.01)

(58) Field of Classification Search
   CPC ................. H01Q 21/28; H03M 1/1028; H04B 10/07955; H04B 10/25752; G01M 11/335; G01M 11/00
   See application file for complete search history.

(56) References Cited

U.S. PATENT DOCUMENTS

| | | | | |
|---|---|---|---|---|
| 2012/0127009 | A1* | 5/2012 | Pagnanelli | H03M 3/468 341/143 |
| 2012/0200435 | A1* | 8/2012 | Ngo | H04B 17/13 341/61 |
| 2018/0160380 | A1 | 6/2018 | Dussmann et al. | |

OTHER PUBLICATIONS

International Searching Authority, "International Search Report and Written Opinion from PCT Application No. PCT/EP2020/052637", from Foreign Counterpart to U.S. Appl. No. 16/752,948, filed Jul. 27, 2020, pp. 1 through 18, Published: WO.

* cited by examiner

MODULE TUNING USING VIRTUAL GAIN CORRECTION

CROSS-REFERENCE TO RELATED APPLICATIONS

This application claims priority to U.S. Provisional Application Ser. No. 62/801,343 same title herewith, filed on Feb. 5, 2019, which is incorporated in its entirety herein by reference.

BACKGROUND

Wireless cellular service providers use base stations to implement wireless communication links with user equipment, such as mobile phones. In particular, a base station is typically in communication with one or more antennas that receive and transmit radio frequency signals to and from user equipment. Each base station in turn is in communication with the service provider's core network. The coverage area of a base station is limited by the transmit power of the associated signals. Moreover, the coverage provided by the transmitted signals is influenced by many other factors such as physical obstacles and interference. Hence, wireless coverage in buildings and stadiums has been traditionally poor when served only from conventional "macro" base stations.

One way that a wireless cellular service provider can improve the coverage provided by a given base station or group of base stations is by using a distributed antenna system (DAS). In a typical DAS, radio frequency (RF) signals are transported between a master unit and one or more remote antenna units using one or more transport cables. The master unit is communicatively coupled to one or more base stations.

Traditionally, RF signals transmitted from the base stations (also referred to here as "downlink RF signals") are received at the master unit. The master unit uses the downlink RF signals to generate one or more downlink transport signals that are distributed to one or more of the remote antenna units over the transport cables. Each such remote antenna unit receives a downlink transport signal and generates a version of the downlink RF signals based on the downlink transport signal and causes the generated downlink RF signals to be radiated from at least one antenna coupled to or included in that remote antenna unit. A similar process is performed in the uplink direction. RF signals transmitted are from user equipment (also referred to here as "uplink RF signals"). Each such uplink RF signal is intended for a base station coupled to the master unit. Each remote antenna unit receives uplink RF signals transmitted from user equipment within its associated coverage area.

Each remote antenna unit uses the received uplink RF signals to generate an uplink transport signal that is transmitted from the remote antenna unit to the master unit. The master unit receives uplink transport signals from the various remote antenna units coupled to it. For each base station coupled to the master unit, the master unit combines uplink signals intended for that base station that are received from the various remote antenna units.

For each base station coupled to the master unit, the master unit ultimately generates uplink RF signals from the combined uplink signals for that base station, which are provided to that base station. Each remote antenna unit can be coupled to each master unit either directly or indirectly via one or more intermediate devices (such as another remote antenna unit or an expansion unit). An indirect connection may be accomplished for example via an optical splitter. In this way, the coverage of each base station can be expanded using the DAS.

Communication between a master unit and associated remote units is often achieved with optical fibers. Optical modules associated with the master unit and remotes units (optical module pairs) are used to convert the RF signals into optical signals, transmit the optical signals over the optical fibers and convert received optical signals back to RF signals. For the optical module to communicate efficiently with each other, the optical modules should be tuned to have the same performance characteristics.

SUMMARY

The following summary is made by way of example and not by way of limitation. It is merely provided to aid the reader in understanding some of the aspects of the subject matter described. Embodiments provide systems and methods of generating reference modules used to effectively and efficiently tune production modules with the use of virtual gain correction.

In one embodiment, a method of establishing a reference module with virtual gain correction is provided. The method includes selecting a golden module pair having a desired measured optimal gain curve for each frequency band covered by the golden module pair for a given application, the golden module pair including a first module and a second module; storing gain values for a select number of frequency observation points along the optimal gain curve for each frequency band; replacing one of the first module or the second module of the golden module pair with a reference module to form a reference offset value generating pair; measuring a reference gain curve of the reference offset value generating pair for each frequency band; comparing gain values of the measured reference gain curve at the select number of frequency observation points with the stored associated gain values at the select number of frequency observation points of the optimal gain curve for each frequency band; determining a gain offset value at each frequency observation point based on the comparison of the gain values of the measured reference gain curve at the select number of frequency observation points with the stored gain values at the select number of frequency observation points along the optimal gain curve for each frequency band; and storing the determined gain offset values at the select number of frequency observation points for each frequency band along with an associated identification of the reference module.

In another example embodiment, a method of tuning a production module using a reference module with virtual gain correction is provided. The method includes selecting an application for a production module; selecting a counterpart reference module created for the application; communicatively coupling the production module to the selected counterpart reference module to generate a production module pair; measuring a production module gain curve for the production module pair for each frequency band to be used by the production module; and tuning the production module based at least in part on offset gain values at select number of frequency observation points for each frequency band associated with the counterpart reference module and values at the select number of frequency observation points of the measured production module gain curve for each frequency band.

In yet another embodiment, a module tuning system with virtual gain correction is provided. The system includes a test signal generator, an output, an input, a controller and memory. The output is used to output test signals from the test signal generator. The input receives the test signals after they have passed through a production module pair that includes a reference module and a production module. The memory is used to store identification information relating to the reference module and associated offset files for given frequency bands, wherein each associated offset file includes offset gain values at select frequency observation points along an associated frequency band. The controller is configured to process the received test signals to determine gain values at the select frequency observation points along the associated frequency band. The controller is further configured to use the offset gain values in the offset files associated with the reference module and the determined gain values to generate a current gain curve used to tune the production module.

BRIEF DESCRIPTION OF THE DRAWINGS

In accordance with common practice, the various described features are not drawn to scale but are drawn to emphasize specific features relevant to the subject matter described. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the embodiments, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

It will be understood that when an element is referred to as being "coupled" to another element, it can be coupled directly to the other element, or intervening elements may also be present. In contrast, when an element is referred to as being "directly coupled" to another element, there are no intervening elements present. Further it will be understood the terms "coupled to" in the context described below may refer to a "communication coupling" between elements which may be a direct communication or may include communications through intervening elements unless expressly referred to as "directly coupled."

Embodiments provide systems and methods of tuning optical modules used in a distributed antenna system (DAS). Examples of optical modules used in a DAS that need to be tuned include master unit/remote antenna unit optical module pairs. For optical module pairs to communicate efficiently with each other, the optical modules of a given pair need to be tuned to have the same performance characteristics.

Figure 1:
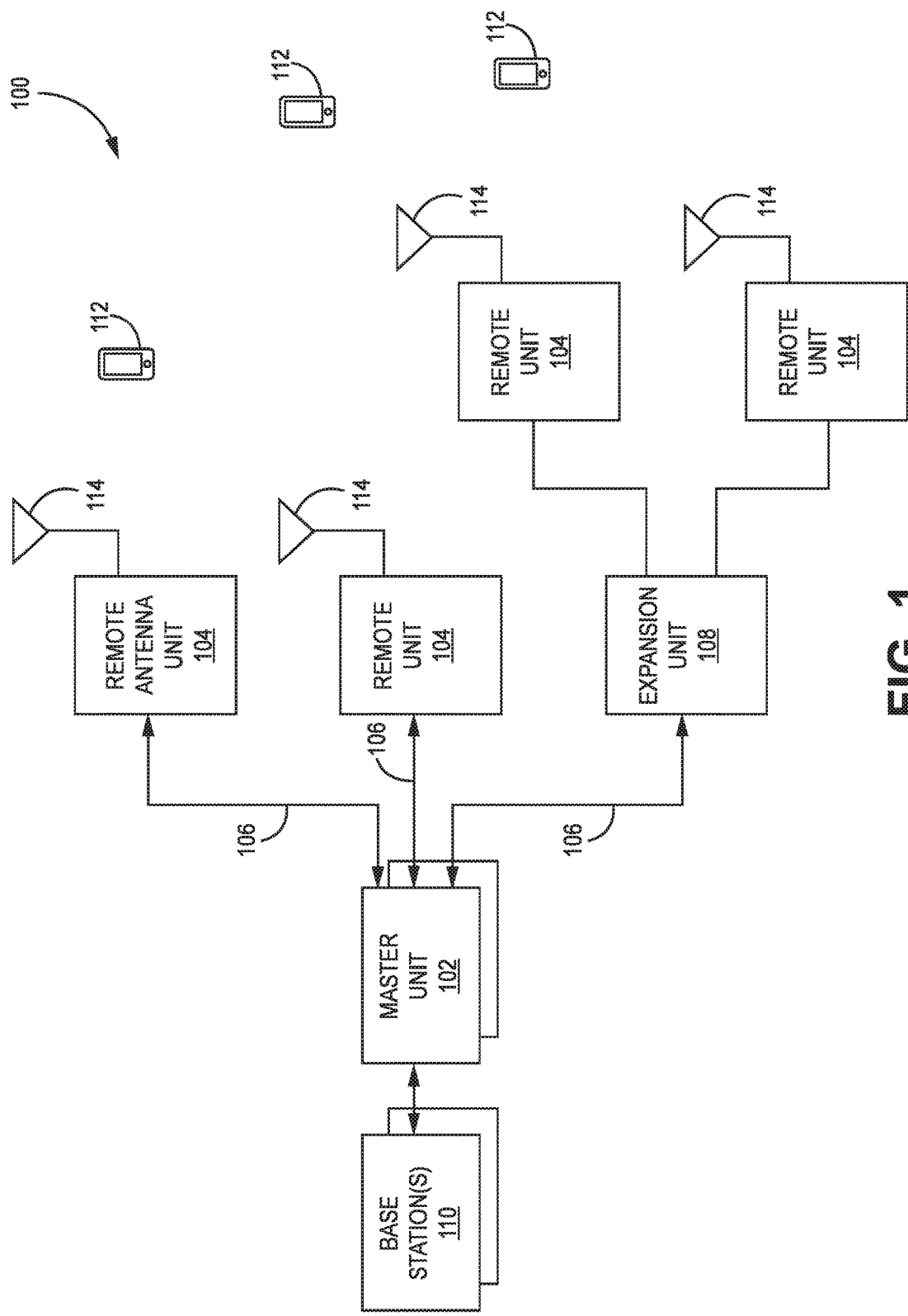
FIG. 1 illustrates a distributed antenna system of the prior art.

Further background is provided in view of DAS 100 illustrated in FIG. 1 to provide a basis of understanding of embodiments. DAS 100 comprises one or more master units 102 that are communicatively coupled to one or more remote antenna units 104 via one or more cables 106. Each remote antenna unit 104 can be communicatively coupled directly to one or more of the master units 102 or indirectly via one or more other remote antenna units 104 and/or via one or more expansion (or other intermediary) unit 108.

Each master unit 102 is communicatively coupled to one or more base stations 110. One or more of the base stations 110 can be co-located with the respective master units 102 to which they are coupled (for example, where each base station 110 is dedicated to providing base station capacity to the system 100 and is coupled to the respective master units 102). Also, one or more of the base stations 110 can be located remotely from the respective master units 102 to which it is coupled (for example, where the base station 110 provides base station capacity to an area beyond the coverage area of the DAS 100). In this latter case, the master unit 102 can be coupled to a donor antenna and repeater or bi-directional amplifier in order to wirelessly communicate with the remotely located base station 110.

The base stations 110 can also be coupled to the master units 102 using a network of attenuators, combiners, splitters, amplifiers, filters, cross-connects, etc., (sometimes referred to collectively as a "point-of-interface" or "POI"). This network can be included in the master units 102 and/or can be separate from the master units 102. This is done so that, in the downlink, the desired set of RF channels output by the base stations 110 can be extracted, combined, and routed to the appropriate master units 102, and so that, in the upstream, the desired set of carriers output by the master units 102 can be extracted, combined, and routed to the appropriate interface of each base station 110. It is to be understood, however, that this is one example and that other embodiments can be implemented in other ways.

In general, each master unit 102 comprises downlink DAS circuitry that is configured to receive one or more downlink signals from one or more base stations 110. Each base station downlink signal includes one or more radio frequency channels used for communicating in the downlink direction with user equipment 112 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, or other protocol).

The downlink DAS circuitry in each master unit 102 is also configured to generate one or more downlink transport signals derived from one or more base station downlink signals and to transmit one or more downlink transport signals to one or more of the remote antenna units 104.

Each remote antenna unit 104 comprises downlink DAS circuitry that is configured to receive the downlink transport signals transmitted to it from one or more master units 102 and to use the received downlink transport signals to generate one or more downlink radio frequency signals that are radiated from one or more coverage antennas 114 associated with that remote antenna unit 104 and/or expansion unit 108 for reception by user equipment 112. In this way, the DAS 100 increases the coverage area for the downlink capacity provided by the base stations 110.

Also, each remote antenna unit 104 and expansion unit 108 may comprises uplink DAS circuitry that is configured to receive one or more uplink radio frequency signals transmitted from the user equipment 112. These signals are analog radio frequency signals.

The uplink DAS circuitry in each remote antenna unit 104 and expansion unit may also be configured to generate one or more uplink transport signals derived from the one or more uplink radio frequency signals and to transmit one or more uplink transport signals to one or more of the master units 102.

Each master unit 102 comprises uplink DAS circuitry that is configured to receive the respective uplink transport signals transmitted to it from one or more remote antenna units 104 and to use the received uplink transport signals to generate one or more base station uplink radio frequency signals that are provided to the one or more base stations 110 associated with that master unit 102. Typically, this involves, among other things, combining or summing uplink signals received from multiple remote antenna units 104 in order to produce the base station signal provided to each base station 110. In this way, the DAS 100 increases the coverage area for the uplink capacity provided by the base stations 110.

In some embodiments (for example, the one shown in FIG. 1), one or more of the remote antenna units 104 are coupled to a master unit 102 via one or more intermediate units 108 (also referred to as "expansion nodes"). This can be done, for example, in order to increase the number of remote antenna units 104 that a single master unit 102 can feed, to increase the master-unit-to-remote-antenna-unit distance, and/or to reduce the amount of cabling needed to couple a master unit 102 to its associated remote antenna units 104. The expansion units 108 are coupled to the master unit 102 and the remote antenna units 104 via one or more transport cables. Each expansion unit 108 comprises downlink DAS circuitry that is configured to receive the downlink transport signals transmitted to it from the master unit 102 (or other expansion unit 108) and transmits the downlink transport signals to one or more remote antenna units 104 or other downstream expansion units 108. Each expansion unit 108 also comprises uplink DAS circuitry that is configured to receive the respective uplink transport signals transmitted to it from one or more remote antenna units 104 or from other downstream expansion units 108, combine or sum the received uplink transport signals, and transmit the combined uplink transport signals upstream to the master unit 102 or other expansion unit 108.

In other embodiments, one or more remote antenna units 104 are coupled to one or more master units 102 via one or more other remote antenna units 104 (for examples, where the remote antenna units 104 are coupled together in a daisy chain or ring topology).

The downlink DAS circuitry and uplink DAS circuitry in each master unit 102, remote antenna unit 104, and expansion unit 108, respectively, can comprise one or more appropriate connectors, attenuators, combiners, splitters, amplifiers, filters, duplexers, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry and uplink DAS circuitry may share common circuitry and/or components.

The DAS 100 can use digital transport, analog transport, or combinations of digital and analog transport for generating and communicating the transport signals between the master units 102, the remote antenna units 104, and any expansion units 108.

In such a DAS embodiment, one or more of the master unit 102, the remote antenna unit 104, or the expansion unit 108 can be implemented at least in part using components that are mounted in a rack or sub-rack.

Optical modules are used in components of the DAS 100 that are communicatively coupled to each other with optical fibers. Examples of components of the DAS using optical modules include master units 102 and remote units 104. Optical modules that allow communication between two components may be referred to as optical module pairs. Optical modules typically include amplifiers to compensate for optical losses that are dependent on a length of optical fibers used to provide the communication link between the components. Further, the optical modules typically include converters to convert RF signal to optical signals and optical signals to RF signals. The optical modules may also include a wavelength division multiplexing (WDM) coupler that routes uplink and downlink optical signals between the optical fibers used to provide the communication link between optical module pairs and converters of the respective optical module. For optical module pairs to communicate efficiently with each other, optical module pairs should be tuned to have the same performance characteristics.

In producing optical modules (which may generally be referred to as just modules), new modules may be tuned with the help of a matching counterpart (called a reference module). Using a reference module as counterpart instead of a using special network analyzer with an RF interface port and optical interface port, is relevantly cheaper, can be applied in both directions and can account for the optical loss. However, due to different filter curves and given tolerances of components of modules, there are limits in duplicating reference modules with regard to gain and flatness. Hence, each reference module has its own unique gain curve. Accordingly, a production module which was tuned with a first reference will have a gain curve that is different than a gain curve of a production module tuned with a second different reference module. One aspect of an embodiment provides an efficient and effective way in generating reference modules used to tune production modules to have the same gain curve using virtual gain correction. Another advantage of using virtual gain correct, no physical tuning of the reference modules, such as adjusting resistances, capacitances and in inductances, needs to occur therein saving money and time.

Figure 2A:
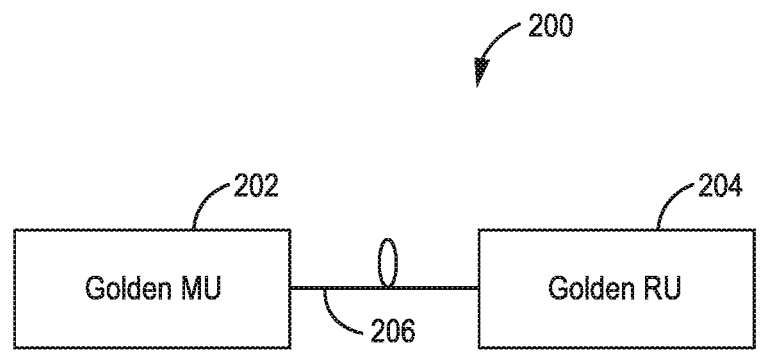
FIG. 2A is a block diagram illustration of a golden module pair according to one exemplary embodiment.
Figure 2B:
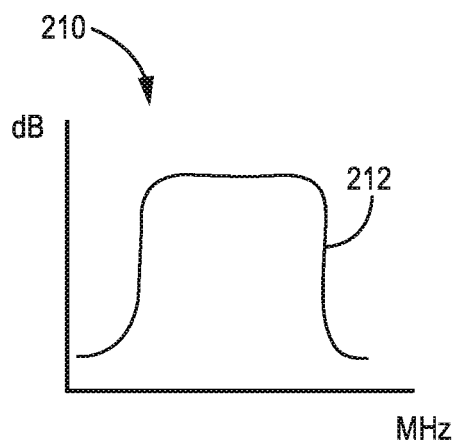
FIG. 2B is a gain curve graph illustrating an optimal gain curve of the golden module pair of FIG. 2A according to one exemplary embodiment.

Embodiments select a golden module pair that are used to generate reference modules. An example golden module pair 200 is illustrated in the block diagram of FIG. 2A. In this example, the golden module pair 200 includes a golden remote antenna unit module 204 and a golden master unit module 202 that are in communication with each other via communication link 206 such as a fiber optic communication link. Other types of golden modules besides golden remote antenna unit modules and golden master unit modules may be used depending on the components in communication. The golden module pair 200 has an optimal gain curve 212 for a given application. An example of the optimal gain curve 212 is illustrated in the gain curve graph 210 of FIG. 2B.

Figure 3:
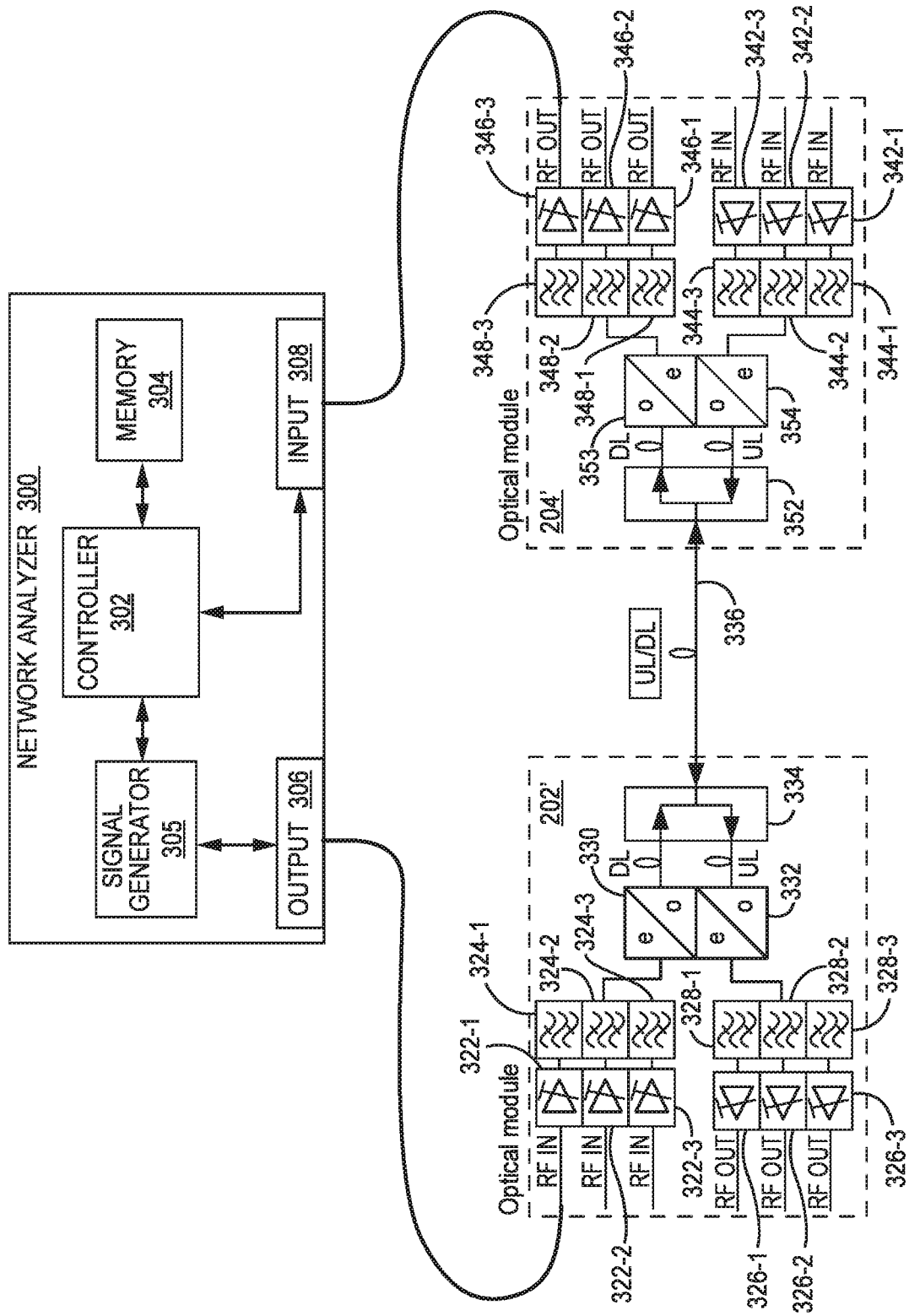
FIG. 3 is an illustration of a system used to identify the golden module pair according to one exemplary embodiment.

To select a golden module pair for a given application, a plurality of different module pairs are tested to find the golden pair 200 with the optimal gain curve 212 for the application. An example of testing for a golden pair is illustrated in FIG. 3. The testing is conducted with a network analyzer 300 that produces an output RF signal at output 306 that is coupled to an input channel of modules 202 or 204. An associated RF output of modules 202 or 204 is coupled to an input 308 of the network analyzer 300. The network analyzer 300 then determines the gain curve. In the example of FIG. 3, the output RF signal is being coupled to an input RF channel of module 202. Further in the example of FIG. 3, the modules 202 and 204 include three channels each covering a select frequency band. The golden pair 200 will have an optimal gain curve across each frequency band. Hence, each input and each output of each module pair is tested and measured. The number of frequency band covered by a golden pair may vary. Hence, embodiments are not limited in the number of frequency bands a module covers.

In the example block diagram of FIG. 3, the network analyzer 300 includes a controller 302 that is in communication with a signal generator 305 and input 308. The controller 302 directs the signal generator 305 to generate RF test signals that are passed to a module pair via output 306. Input 308 is configured to receive RF output signals from the module pair which are passed on the controller 302. A memory 304 is used to store instructions executed by the controller 302 in generating the test signals and processing received signals through the input 308. The memory 304 in an embodiment, also stores processed input data and identification information relating to reference modules as discussed below in detail.

In general, the controller 302 (processor) may include any one or more of a microprocessor, a digital signal processor (DSP), an application specific integrated circuit (ASIC), a field program gate array (FPGA), or equivalent discrete or integrated logic circuitry. In some example embodiments, controller 302 may include multiple components, such as any combination of one or more microprocessors, one or more controllers, one or more DSPs, one or more ASICs, one or more FPGAs, as well as other discrete or integrated logic circuitry. The functions attributed to controller 302 herein may be embodied as software, firmware, hardware or any combination thereof. Memory 304 may include computer-readable instructions that, when executed by controller 302 provide functions of the network analyzer 300. Such functions may include the functions of measuring gain curves and determining offset values. The computer readable instructions may be encoded within the memory 304. Memory 304 may comprise computer readable storage media including any volatile, nonvolatile, magnetic, optical, or electrical media, such as, but not limited to, a random access memory (RAM), read-only memory (ROM), non-volatile RAM (NVRAM), electrically-erasable programmable ROM (EEPROM), flash memory, or any other storage medium.

Module 202' of the FIG. 3 example includes three RF inputs to respective amplifiers 322-1, 322-2 and 322-3 in the downlink direction. Outputs of the amplifiers 322-1, 322-2 and 322-3 are coupled to RF filters 324-1, 324-2 and 324-3 in downlink direction. An output of the RF filters is coupled to a RF to optical converter 330. Further, an output of converter 330 in the downlink direction is coupled to a wavelength division multiplexer (WDM) coupler 334 which communicates the converted signals to module 204' of the module pair via fiber 336. Optical signals being uplinked from the module 204' via fiber 336 are received by the WDM coupler 334 which outputs the signals to an optical to RF converter 332. An output of the converter 332 is coupled to filters 328-1, 328-2 and 328-3. Outputs of the filters 328-1, 328-2 and 328-3 are coupled to respective amplifiers 326-1, 326-2 and 326-3 which in turn provide three respective RF outputs.

Module 204' is identical to the first module 202' in this example embodiment. Module 204 includes three RF inputs to respective amplifiers 342-1, 342-2 and 342-3 and RF filters 344-1, 344-2 and 344-3 in the uplink direction. An output of the RF filters is coupled to a RF to optical converter 354. Further an output of converter 354 in the uplink direction is coupled to a WDM coupler 352 which communicates the converted signals to module 202' of the module pair via fiber 336. Optical signals being downlinked from module 202' via fiber 336 are received by the WDM coupler 352 which outputs the signals to an optical to RF converter 353. An output of the converter 353 is coupled to filters 348-1, 348-2 and 348-3. Outputs of the filters 348-1, 348-2 and 348-3 are coupled to respective amplifiers 346-1, 346-2 and 346-3 which in turn provide three respective RF outputs.

The output 306 of the network analyzer 300 is selectively coupled to each RF input of the modules 202' and 204' while the respective RF outputs (associated with same frequency bands) of the modules 202' and 204' are coupled to the input of the network analyzer 300. The network analyzer 300 tests the modules 202' and 204' for each frequency band. One or both modules may be replaced (switched out) with different modules until the network analyzer 300 measures the optimal gain curve for a given application for each frequency band. Once the optimal gain curve for a given application for each frequency band is measured, a golden module pair 200 is found that includes golden module 202 and golden module 204.

Figure 4:
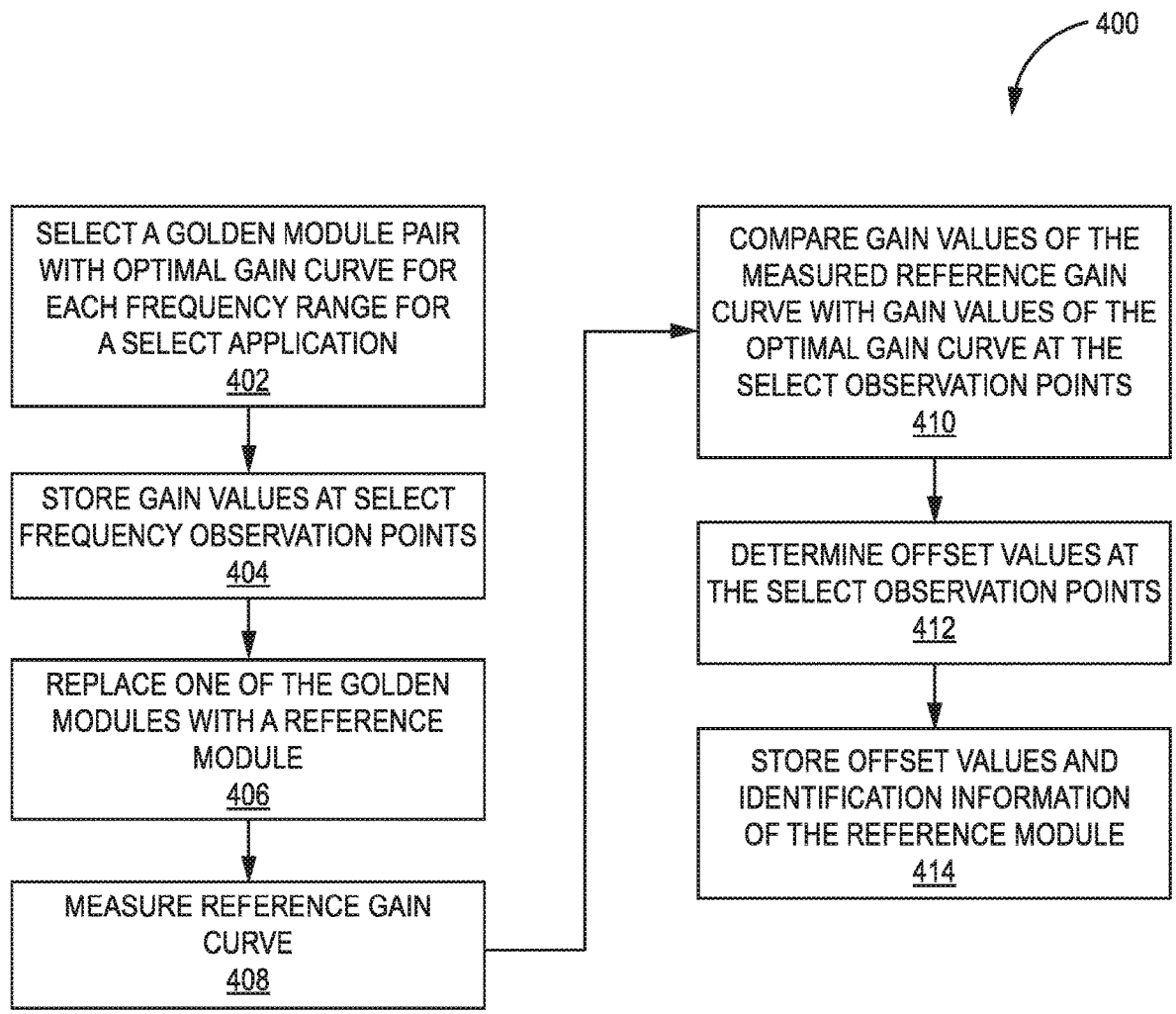
FIG. 4 is a reference module setup flow diagram according to one exemplary embodiment.

The golden module pair 200 is used to create reference modules. FIG. 4 illustrates a reference module setup flow diagram 400 of one embodiment. The reference module set up flow diagram 400 includes a series of sequential steps or blocks. The order of sequence of steps may occur in a different order. Hence, embodiments are not limited to the sequential order set out in FIG. 4.

The first step (402) of the reference module setup flow diagram 400 includes selecting the golden module pair 200 with the optimal gain curve 212 for each frequency range used by the module pair for a select application. This may be done, as discussed above, by replacing (switching out) modules until the desired optimal gain curve 212 for each frequency range is measured with a golden module pair 200 with a network analyzer 300. Once a golden module pair 200 is selected, the gain values of the measured optimal gain curve 212 at select frequency observation points are stored in memory, such as memory 304 of the network analyzer 300. In another embodiment, the gain values at the select frequency observation points are communicated to a remote location over an interface, such as for example, through a general purpose interface bus (GPIB) or Ethernet, and then stored remotely. The number of frequency observation points used may vary depending on the desired level of accuracy needed in generating a reference module and the frequency band range being observed. An example number of frequency observation points is 1601 observation points across a select frequency band.

Figure 6A:
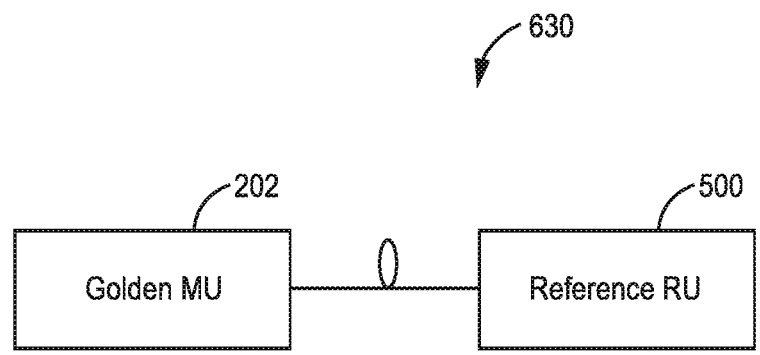
FIG. 6A is a block diagram of a reference module pair according to one exemplary embodiment.

Once the gain values for the select frequency observation points of the optimal gain curve are stored, a reference module can be processed for use. This process starts by replacing one of the golden modules with a reference module at step (406) to form a reference offset value generating pair 630. Either the one of the golden remote antenna unit module 204 or the golden master unit module 202 may be replaced depending on the reference module to be generated. An example of this is illustrated in FIG. 4, where golden module 204 has been replaced with a reference module 500 to form a reference module pair 630 illustrated in FIG. 6A.

Figure 5:
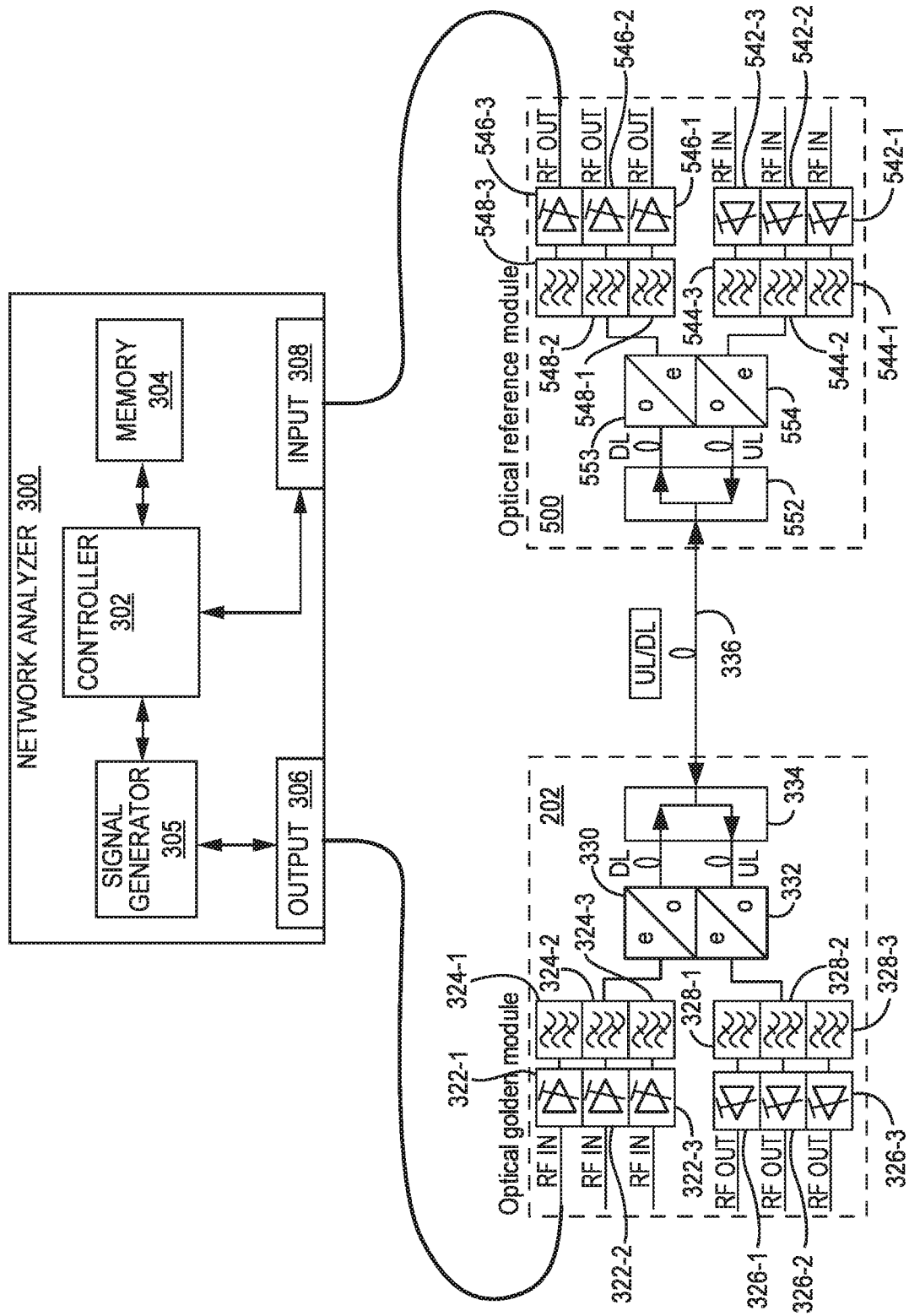
FIG. 5 is an illustration of a system used to prepare a reference module according to one exemplary embodiment.

Reference module 500, in this embodiment, includes the same components as the golden module 204 as illustrated in FIG. 5. In particular, the components include three RF inputs to respective amplifiers 542-1, 542-2 and 542-3 and RF filters 544-1, 544-2 and 544-3 in the uplink direction. An output of the RF filters is coupled to a RF to optical converter 554. Further an output of converter 554 in the uplink direction is coupled to a WDM coupler 552 which communicates the converted signals to golden module 202 of the reference module pair via fiber 336. Optical signals being downlinked from golden module 202 via fiber 336 are received by the WDM coupler 552 which outputs the signals to an optical to RF converter 553. An output of the converter 553 is coupled to filters 548-1, 548-2 and 548-3. Outputs of the filters 548-1, 548-2 and 548-3 are coupled to respective amplifiers 546-1, 546-2 and 546-3 which in turn provide three respective RF outputs.

Figure 6B:
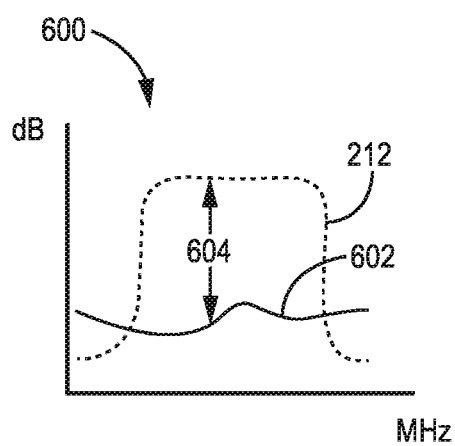
FIG. 6B is a gain curve graph illustrating a measured reference gain curve and the optimal gain curve according to one exemplary embodiment.

Once the golden module 204 is replaced with reference module 500, the network analyzer 300 is used to measure a reference gain curve 602 of the reference offset value generating pair 630. This occurs in step (408) of the reference module setup flow diagram 400. An example of a gain curve graph 600 that includes the optimal gain curve 212 and the measured reference gain curve 602 is illustrated in FIG. 6B. Also illustrated in gain curve graph 600 is an offset 604 in dB at one frequency observation point between the optimal gain curve 212 and the measured reference gain curve 602.

The gain values of the measured reference gain curve are compared with the gain values of the optimal gain curve at the select frequency observation points at step (410) of the setup flow diagram 400. Offset values between the measured reference gain curve and the optimal gain curve at each frequency observation point are then determined at step (412). This occurs for each frequency band used by the reference module pair 630. In one embodiment, the offset values are obtained by subtracting the measured gain values from the optimum gain curve values at each select frequency observation point. Hence the offset values may be positive or negative based on the measured gains values.

The offset values, frequency band information and information identifying the reference module are stored in memory at step (414). In one embodiment, the memory is memory 304 of the network analyzer 300. The identifying information identifies which offset values are associated with which reference module. The identification information and associated offset values of the reference module are used when tuning production modules.

Figure 7:
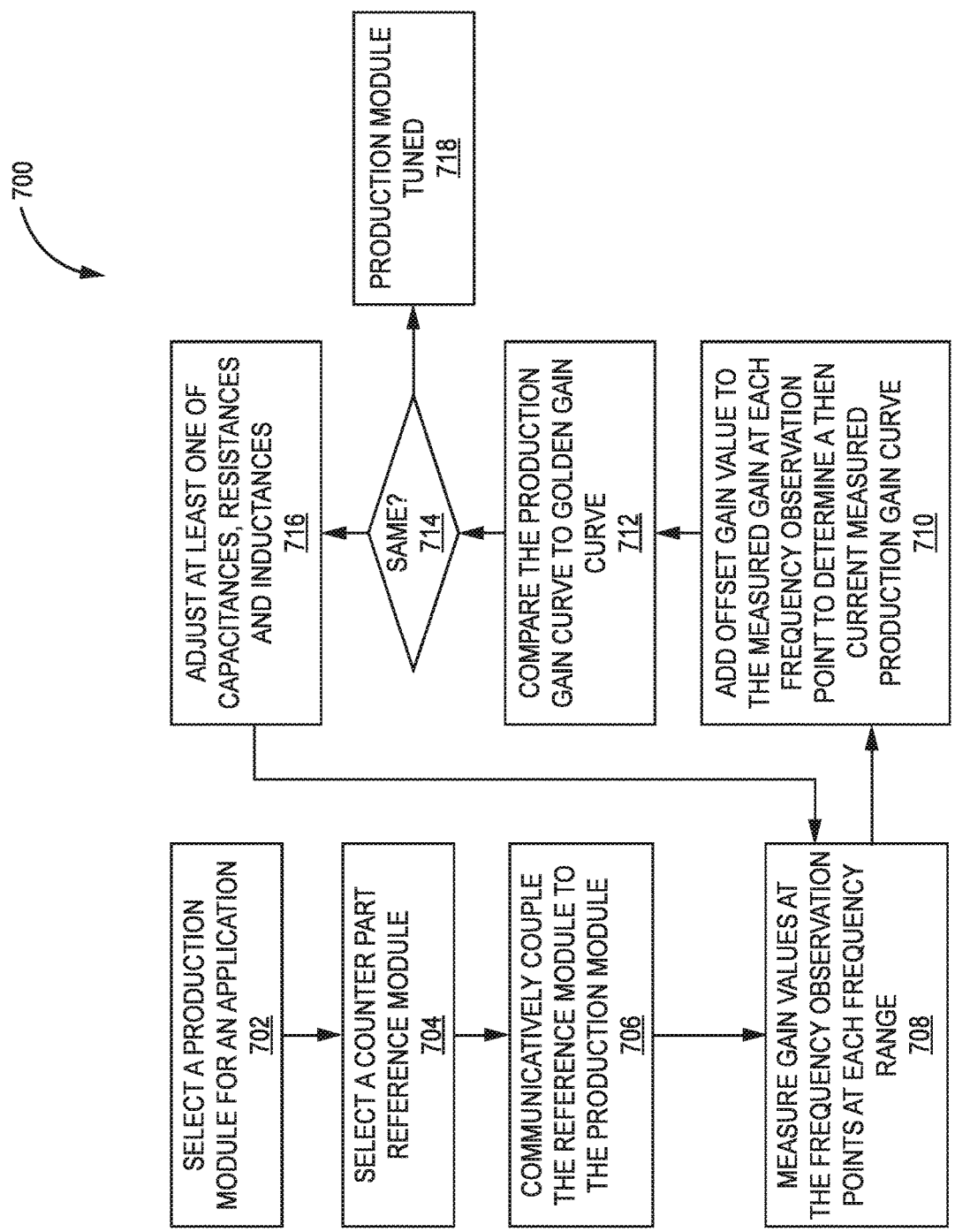
FIG. 7 a tuning flow diagram according to one exemplary embodiment.

FIG. 7 illustrates a tuning flow diagram 700. The tuning flow diagram 400 includes a series of sequential steps or blocks. The order of sequence of steps may occur in a different order. Hence, embodiments are not limited to the sequential order set out in FIG. 7.

At step (702), a production module for a specific application is selected. A counterpart reference module for the application is selected at step (704). The production module 800 and reference module 500 are communicatively coupled at step (706) to form a production module pair 801. A network analyzer 300 is then coupled to measure gain values at the frequency observation points for each frequency range of the production module pair 801 at step (708).

Figure 8:
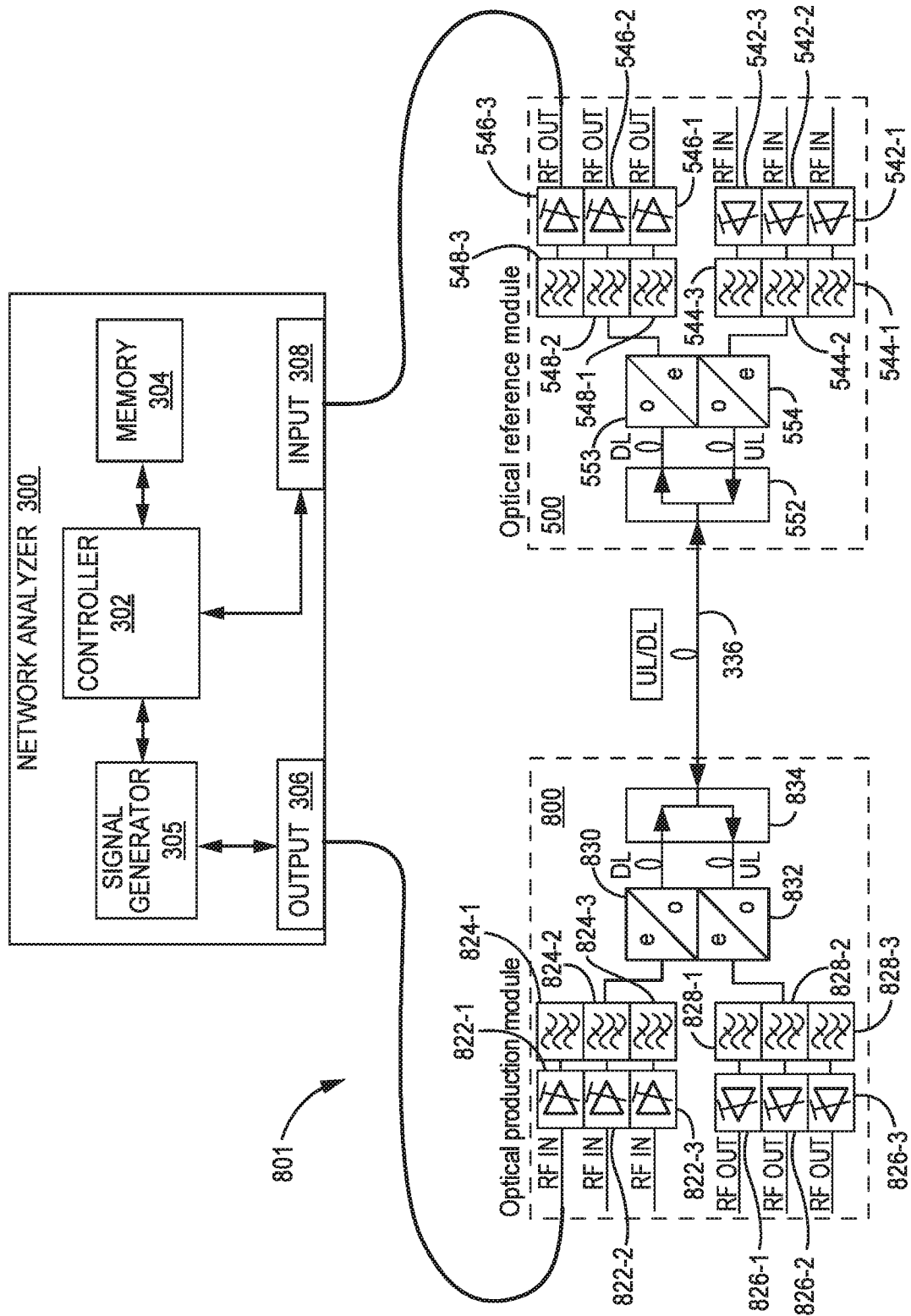
FIG. 8 is an illustration of a system used to tune a production module according to one exemplary embodiment.

An example of the network analyzer 300 coupled to the production module pair 801 is illustrated in FIG. 8. The production module 800 includes the same components as golden module 202 illustrated in FIG. 4. The components include three RF inputs to respective amplifiers 822-1, 822-2 and 822-3 and RF filters 824-1, 824-2 and 824-3 in the downlink direction. An output of the RF filters 824-1, 824-2 and 824-3 is coupled to a RF to optical converter 830. Further, an output of converter 830 in the downlink direction is coupled to a WDM coupler 834 which communicates the converted signals to the reference module 500 of the production module pair via fiber 336. Optical signals being uplinked from the production module 500 via fiber 336 are received by the WDM coupler 834 which outputs the signals to an optical to RF converter 832. An output of the converter 832 is coupled to filters 828-1, 828-2 and 828-3. Outputs of the filters 828-1, 828-2 and 828-3 are coupled to respective amplifiers 826-1, 826-2 and 826-3 which in turn provide three respective RF outputs.

In the tuning flow diagram 700 embodiment of FIG. 7, the offset gain values associated with the reference module 500 at each frequency observation point are added to the measure gain values of the production module pair at each frequency observation point to determine the measured production gain curve at step (710). The production gain curve is then compared to the optimal gain curve 212 of the golden module pair 200 at step (712). This is done by comparing the gain values at each frequency observation point between the production gain curve and the optimal gain curve 212. If the gain values of the production gain curve are the same as the gain values of the optimal gain curve 212, the production module 800 is determined to be tuned at step (718). In one embodiment, the production gain curve is compared with the optimal gain curve that includes limit lines. Limit lines about the optimal gain curve 212 provides a range of acceptable values associated with the optimal gain values at the frequency observation points. For example, an optimal gain value at a select frequency observation point may be 17 dB+/−1 dB. The range may be set based on the module specification. Hence, this embodiment provides an upper and lower limit line in which the measured gain must be in between for there to be a considered match for tuning purposes. This embodiment is helpful when an exact match of the optimal gain curve is difficult to achieve.

If it is determined at step (714) that the gain values of the production gain curve are not the same as the gain values of the optimal gain curve 212, an adjustment of the production module 800 is made a step 716. An adjustment may be made by changing at least one of capacitance, resistance and inductance of the production module 800. The process then continues at step (708) wherein the gain values are then again measured by the network analyzer 300 at the frequency observation points after the adjustment. The process continues until the production gain curve is the same as the optimal gain curve 212 or within associated limit lines. In this embodiment, the tuning occurs for each frequency band so the production gain curve is the same, or within associated limit lines, of the optimal gain curve 212 for each frequency band.

Figure 9:
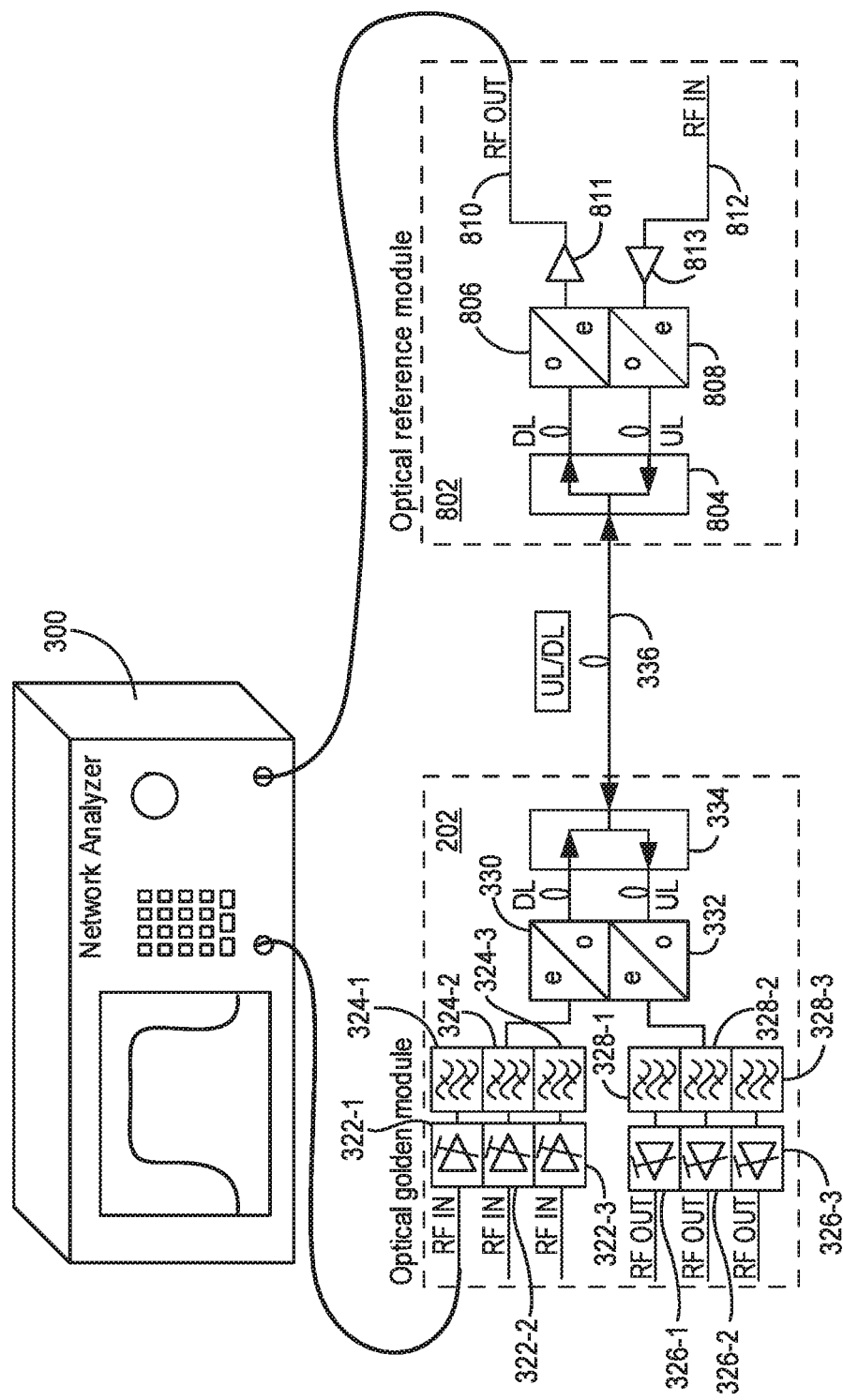
FIG. 9 is an illustration of a system to prepare a wideband reference module according to one exemplary embodiment.

In another embodiment, a wideband reference module 802 is created that can be used to tune production modules that cover any number of frequency bands. In this example, offset files across a plurality frequency band are determined and stored in memory 304 for an associated reference module. An example of determining offset values for a wideband reference module is illustrated in FIG. 9. In this example, the reference module 802 does not include RF filters and amplifiers used for specific bandwidth frequency channels but may include broadband amplifiers generally designated as 811 and 813. Reference module 802 includes a WDM coupler 804 coupled to send and receive communications over communication link 336, an optical to RF signal converter 806 and a RF to optical signal converter 808. The optical to RF signal converter 806 is coupled to covert signals from the WDM coupler to an RF output 810 that is amplified by broadband amplifier 811. The RF to optical signal converter 808 is coupled to convert input RF signals, amplified by broadband amplifier 813, from an RF input 812 to the WDM coupler 804.

Golden modules are coupled to communicate with the wideband reference module 802 via fiber 336. An example of a golden module 202 communicatively coupled to the reference module 802 is illustrated in FIG. 9. The network analyzer 300 measures a reference gain curve and compares it against the optimal gain curve 212 for the associated golden pair 200. This is done by comparing the gain values at each frequency observation point. As the result of the comparison, offset values are calculated and stored in files in the memory 304. The files are associated with a frequency range and identification information regarding the reference module 802. Since, reference module 802 does not include the RF filter and amplifier for specific frequency ranges, one or more additional golden modules that cover different frequency bands may be communicatively coupled to the reference module 802 with the network analyzer therein determining and storing offset values associated with the different frequency ranges. Hence in this embodiment, a reference module can be made that covers a wideband of frequencies. This reduces the number of reference modules needed to create production modules.

Figure 10:
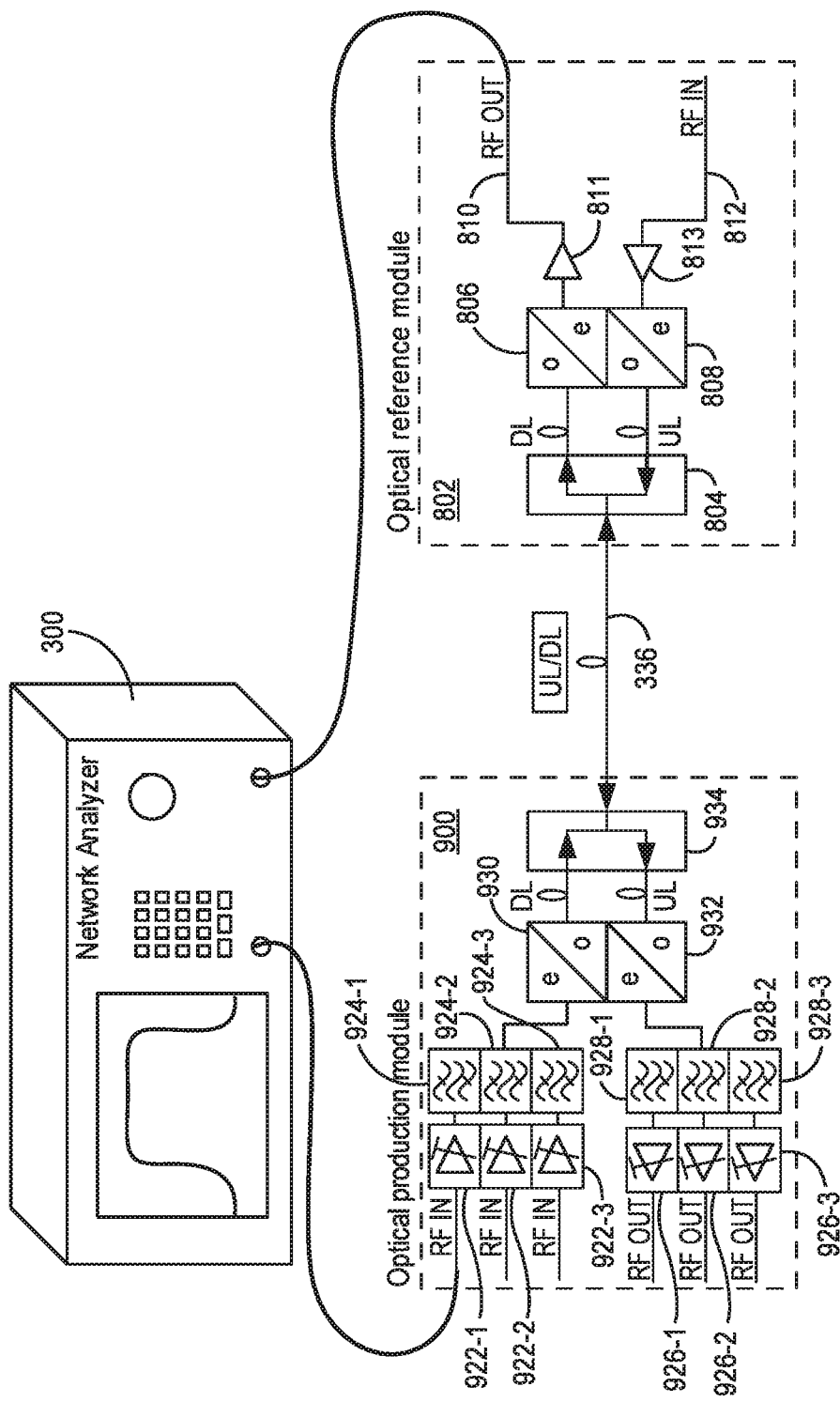
FIG. 10 is an illustration of a system used to tune a production module with the wideband reference module according to one exemplary embodiment.

The golden module 202 is replaced with a production module 900 when generating a production module as illustrated in FIG. 10. In this example, the production module 900 includes three frequency band channels. The components in this example of a production module include three RF inputs to respective amplifiers 922-1, 922-2 and 922-3 and RF filters 924-1, 924-2 and 924-3 in the downlink direction. An output of the RF filters is coupled to a RF to optical converter 930. Further an output of converter 930 in the downlink direction is coupled to a WDM coupler 934 which communicates the converted signals to the wideband reference module 802 via fiber 336. Optical signals being uplinked from the broadband reference module 802 via fiber 336 are received by the WDM coupler 934 which outputs the signals to an optical to RF converter 932. An output of the converter 932 is coupled to filters 928-1, 928-2 and 928-3. Outputs of the filters 928-1, 928-2 and 928-3 are coupled to respective amplifiers 926-1, 926-2 and 926-3 which in turn provide three respective RF outputs.

Tuning of production module 900 is accomplished by selecting offset files associated with broadband reference module 802 that cover the frequency bands covered by the production module 900. The network analyzer 300 measures the gain curve and adds the offset values in the associated files to get a production module/wideband reference module gain curve that is compared to the optimal gain curve. As discussed above, the comparison may be to the optimal gain curve with limit lines based on the module specification. If the gain curves are not the same, at least one of capacitance, resistance and inductance in the production module are adjusted until the gains are the same. Once they are the same or are within the limit lines of the optimal gain curve, the production module 900 is tuned. As discussed above, since the broadband reference module has a plurality of associated offset value files for a plurality of frequency bands, it can be used to tuned production modules that cover different frequency bands.

Example Embodiments

Example 1 is a method of establishing a reference module with virtual gain correction. The method includes selecting a golden module pair having a desired measured optimal gain curve for each frequency band covered by the golden module pair for a given application, the golden module pair including a first module and a second module; storing gain values for a select number of frequency observation points along the optimal gain curve for each frequency band; replacing one of the first module and the second module of the golden module pair with a reference module to form a reference offset value generating pair; measuring a reference gain curve of the reference offset value generating pair for each frequency band; comparing gain values of the measured reference gain curve at the select number of frequency observation points with the stored associated gain values at the select number of frequency observation points of the optimal gain curve for each frequency band; determining a gain offset value at each frequency observation point based on the comparison of the gain values of the measured reference gain curve at the select number of frequency observation points with the stored gain values at the select number of frequency observation points along the optimal gain curve for each frequency band; and storing the determined gain offset values at the select number of frequency observation points for each frequency band along with an associated identification of the reference module.

Example 2 includes the method of Example 1, wherein the reference module is one of a master unit reference module and a remote antenna unit reference module.

Example 3 includes the method of any of the Examples 1-2, wherein selecting the golden module pair having the desired measured optimal gain curve for each frequency band further includes communicatively coupling the first module to the second module; coupling RF input signals to inputs ports of one of the first module and the second module; measuring output RF signals at output ports of the other of the first module and the second module in response to the RF input signals to determine a measured gain curve for each frequency band; and switching out at least one of the first module and the second module until the optimal gain curve is measured for each frequency band.

Example 4 includes the method of any of the Examples 1-3, wherein determining the gain offset value at each frequency observation point based on the comparison of the gain values of the measured reference gain curve at the select number of frequency observation points with the stored gain values at the select number of frequency observation points along the optimal gain curve for each frequency band further includes subtracting each gain value of the measured reference gain curve from an associated gain value of the optimal gain curve at each frequency observation point.

Example 5 includes the method of any of the Examples 1-4, further comprising replacing the other one of the first and second modules of the golden module pair with at least one third module that covers at least one different frequency band.

Example 6 includes the method of any of the Examples 1-5, further including communicatively coupling the reference module to a production module to be tuned; and tuning the production module based on a measure curve gain of the communicatively coupled reference module and production module and the stored offset values associated with the reference module.

Example 7 includes a method of tuning a production module using a reference module with virtual gain correction. The method includes selecting an application for a production module; selecting a counterpart reference module created for the application; communicatively coupling the production module to the selected counterpart reference module to generate a production module pair; measuring a production module gain curve for the production module pair for each frequency band to be used by the production module; and tuning the production module based at least in part on offset gain values at select number of frequency observation points for each frequency band associated with the counterpart reference module and gain values at the select number of frequency observation points of the measured production module gain curve for each frequency band.

Example 8 includes the method of Example 7, wherein the offset gain values at a select number of frequency observation points for each frequency band associated with the counterpart reference module are generated by comparing gain values at the select number of frequency observation points between a gain curve of a reference offset value generating pair that includes the counterpart reference module and an optimal gain curve.

Example 9 includes the method of any of the Examples 7-8, wherein the production module is one of a master unit module and a remote antenna unit and the selected counterpart reference module is one of the other of the master unit module and remote antenna unit.

Example 10 includes the method of any of the Examples 7-8, wherein selecting the reference module created for the application further includes reading identification information stored in a memory.

Example 11 includes the method of any of the Examples 7-10, wherein tuning the production module based at least in part on the offset gain values at the select number of frequency observation points for each frequency band associated with the counterpart reference module and values at the select number of frequency observation points of the measured production module gain curve for each frequency band further includes adjusting at least one of capacitance, resistance and inductance values in the production module until at least one of the measured gain values at the select number of frequency observation points of the production model gain curve along with the offset gain values at the select number of observation points match a desired optimal gain curve and the measured gain values at the select number of frequency observation points of the production model gain curve along with the offset gain values at the select number of observation points are within limit lines of the desired optimal gain curve.

Example 12 includes the method of any of the Examples 7-11, wherein the offset gain value at each frequency observation point for each frequency is added to the measured value at each frequency observation point for each frequency band.

Example 13 includes the method of any of the Examples 7-12, wherein measuring the production module gain curve for the production module pair for each frequency band to be used by the production module further includes coupling an input RF signal to an input of one of the reference module and production module of the production module pair; coupling an associated output of another one of the reference module and production module of the production module pair to an input of the network analyzer; and measuring the production module gain curve for the production module pair for each frequency band based on the output.

Example 14 is a module tuning system with virtual gain correction. The system includes a test signal generator, an output, an input, a controller and memory. The output is used to output test signals from the test signal generator. The input receives the test signals after they have passed through a production module pair that includes a reference module and a production module. The memory is used to store identification information relating to the reference module and associated offset files for given frequency bands, wherein each associated offset file includes offset gain values at select frequency observation points along an associated frequency band. The controller is configured to process the received test signals to determine gain values at the select frequency observation points along the associated frequency band. The controller is further configured to use the offset gain values in the offset files associated with the reference module and the determined gain values to generate a current gain curve used to tune the production module.

Example 15 includes the system of example 14, wherein the reference module is one of a master unit module and a remote antenna unit module and the production module includes the other of the master unit module and the remote antenna unit module.

Example 16 includes the system of any of the Examples 14-15, wherein the reference module includes at least one wavelength division multiplexer and a converter to covert signals between radio frequency (RF) signals and optical signals and optical signals and RF signals.

Example 17 includes the system of Example 16, wherein the reference module includes at least one RF filter and at least one amplifier for each frequency band.

Example 18 includes the system of any of the Examples 14-17, wherein at least one of capacitances, resistances and inductances are adjusted in the production module until the network analyzer indicates at least one of the current gain curve measured by the network analyzer matches a desired optimal gain curve and the current gain curve measured by the network analyzer is within limit lines of the desired optimal gain curve.

Example 19 includes the system of any of the Examples 14-18, wherein the controller is further configured to determine the offset gain values by comparing gain values at the select number of frequency observation points between a gain curve of a reference offset value generating pair that includes the counterpart reference module and an optimal gain curve.

Example 20 includes the system of Example 19, wherein the optimal gain curve is measured from a golden module pair that includes the reference module.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method of tuning a production module using a reference module with virtual gain correction, the method comprises:
    selecting an application for the production module; selecting a counterpart reference module created for the application; communicatively coupling the production module to the selected counterpart reference module to generate a production module pair;
    measuring a production module gain curve for the production module pair for each frequency band to be used by the production module; and
    tuning the production module based at least in part on offset gain values at select number of frequency observation points for each frequency band associated with the counterpart reference module and gain values at the select number of frequency observation points of the measured production module gain curve for each frequency band.

2. The method of claim 1, wherein the offset gain values at a select number of frequency observation points for each frequency band associated with the counterpart reference module are generated by comparing gain values at the select number of frequency observation points between a gain curve of a reference offset value generating pair that includes the counterpart reference module and an optimal gain curve.

3. The method of claim 1, wherein the production module is one of a master unit module and a remote antenna unit and the selected counterpart reference module is one of the other of the master unit module and remote antenna unit.

4. The method of claim 1, wherein selecting the reference module created for the application further comprises:
    reading identification information stored in a memory.

5. The method of claim 1, wherein tuning the production module based at least in part on the offset gain values at the select number of frequency observation points for each frequency band associated with the counterpart reference module and values at the select number of frequency observation points of the measured production module gain curve for each frequency band further comprises:
    adjusting at least one of capacitance, resistance and inductance values in the production module until at least one of the measured gain values at the select number of frequency observation points of the production model gain curve along with the offset gain values at the select number of observation points match a desired optimal gain curve and the measured gain values at the select number of frequency observation points of the production model gain curve along with the offset gain values at the select number of observation points are within limit lines of the desired optimal gain curve.

6. The method of claim 1, wherein the offset gain value at each frequency observation point for each frequency is added to the measured value at each frequency observation point for each frequency band.

7. The method of claim 1, wherein measuring the production module gain curve for the production module pair for each frequency band to be used by the production module further comprises:
    coupling an input radio frequency (RF) signal to an input of one of the reference module and production module of the production module pair;
    coupling an associated output of another one of the reference module and production module of the production module pair to an input of the network analyzer; and measuring the production module gain curve for the production module pair for each frequency band based on the output.

8. A module tuning system with virtual gain correction, the system comprising:
    a test signal generator;
    an output to output test signals from the test signal generator;
    an input to receive the test signals after they have passed through a production module pair that includes a reference module and a production module;
    a memory to store identification information relating to the reference module and associated offset files for given frequency bands, wherein each associated offset file includes offset gain values at select frequency observation points along an associated frequency band; and
    a controller configured to process the received test signal to determine gain values at the select frequency observation points along the associated frequency band, the controller further configured to use the offset gain values in the offset files associated with the reference module and the determined gain values to generate a current gain curve used to tune the production module.

9. The system of claim 8, wherein the reference module is one of a master unit module and a remote antenna unit module and the production module includes the other of the master unit module and the remote antenna unit module.

10. The system of claim 8, wherein the reference module includes at least one wavelength division multiplexer and a converter to covert signals between radio frequency (RF) signals and optical signals and optical signals and RF signals.

11. The system of claim 10, wherein the reference module includes at least one RF filter and at least one amplifier for each frequency band.

12. The system of claim 8, wherein at least one of capacitances, resistances and inductances are adjusted in the production module until the network analyzer indicates at least one of the current gain curve measured by the network analyzer matches a desired optimal gain curve and the current gain curve measured by the network analyzer is within limit lines of the desired optimal gain curve.

13. The system of claim 8, wherein the controller is further configured to determine the offset gain values by comparing gain values at the select number of frequency observation points between a gain curve of a reference offset value generating pair that includes the counterpart reference module and an optimal gain curve.

14. The system of claim 13, wherein the optimal gain curve is measured from a golden module pair that includes the reference module.

* * * * *

UNITED STATES PATENT AND TRADEMARK OFFICE
CERTIFICATE OF CORRECTION

PATENT NO. : 11,204,380 B2
APPLICATION NO. : 16/752948
DATED : December 21, 2021
INVENTOR(S) : Rauwolf et al.

Page 1 of 1

It is certified that error appears in the above-identified patent and that said Letters Patent is hereby corrected as shown below:

On the Title Page

Column 2, Line 1, References:
--GN 107612615 A-- should read "CN 107612615 A".

Signed and Sealed this
Thirteenth Day of June, 2023

Katherine Kelly Vidal
*Director of the United States Patent and Trademark Office*